(12) United States Patent
Ker et al.

(10) Patent No.: US 7,932,748 B1
(45) Date of Patent: Apr. 26, 2011

(54) 2×VDD-TOLERANT LOGIC CIRCUITS AND A RELATED 2×VDD-TOLERANT I/O BUFFER WITH PVT COMPENSATION

(75) Inventors: Ming-Dou Ker, Kaohsiung (TW); Yan-Liang Lin, Kaohsiung (TW); Chua-Chin Wang, Kaohsiung (TW)

(73) Assignee: National Sun Yat-Sen University, Koahsiung (TW)

( * ) Notice: Subject to any disclaimer, the term of this patent is extended or adjusted under 35 U.S.C. 154(b) by 0 days.

(21) Appl. No.: 12/640,724

(22) Filed: Dec. 17, 2009

(51) Int. Cl.
*H03K 19/0175* (2006.01)
(52) U.S. Cl. .............................. 326/81; 326/68; 326/80
(58) Field of Classification Search .................. None
See application file for complete search history.

(56) References Cited

U.S. PATENT DOCUMENTS

| | | | |
|---|---|---|---|
| 7,046,036 B2 * | 5/2006 | Chen et al. | 326/56 |
| 7,123,066 B2 | 10/2006 | Bazes | |
| 7,495,465 B2 | 2/2009 | Khan et al. | |
| 7,579,861 B2 | 8/2009 | Shin et al. | |
| 2006/0091907 A1 * | 5/2006 | Khan | 326/81 |

OTHER PUBLICATIONS

Khan et al., "Techniques for On-Chip Process Voltage and Temperature Detection and Compensation," Proceedings of the 19th International Conference on VLSI Design (VLSID '06), 1063-9667/06, 2006 IEEE.

* cited by examiner

*Primary Examiner* — Anh Q Tran
(74) *Attorney, Agent, or Firm* — Muncy, Giessler, Olds & Lowe, PLLC

(57) ABSTRACT

A 2×VDD-tolerant input/output (I/O) buffer circuit with process, voltage, and temperature (PVT) compensation suitable for CMOS technology is disclosed. A 2×VDD-tolerant I/O buffer with a PVT compensation circuit is implemented with novel 2×VDD-tolerant logic gates. Output slew rate variations can be kept within smaller ranges to match maximum and minimum timing specifications. A 2×VDD tolerant logic circuit for implementing the I/O buffer is also disclosed.

4 Claims, 16 Drawing Sheets

| S2 | S1 | S0 | D0 | D1 | D2 | D3 | D4 | D5 | D6 | D7 |
|----|----|----|----|----|----|----|----|----|----|----|
| 0  | 0  | 0  | 0  | 0  | 0  | 0  | 0  | 0  | 0  | 1  |
| 0  | 0  | 1  | 0  | 0  | 0  | 0  | 0  | 0  | 1  | 0  |
| 0  | 1  | 0  | 0  | 0  | 0  | 0  | 0  | 1  | 0  | 0  |
| 0  | 1  | 1  | 0  | 0  | 0  | 0  | 1  | 0  | 0  | 0  |
| 1  | 0  | 0  | 0  | 0  | 0  | 1  | 0  | 0  | 0  | 0  |
| 1  | 0  | 1  | 0  | 0  | 1  | 0  | 0  | 0  | 0  | 0  |
| 1  | 1  | 0  | 0  | 1  | 0  | 0  | 0  | 0  | 0  | 0  |
| 1  | 1  | 1  | 1  | 0  | 0  | 0  | 0  | 0  | 0  | 0  |

FIG. 14

Normalized Supply Voltage

| | | | | | |
|---|---|---|---|---|---|
| 0 °C | 3.16 / 2.83 | 3.38 / 3.12 | 3.91 / 3.42 | 4.25 / 3.71 | 4.69 / 3.90 |
| 25 °C | 3.05 / 2.67 | 3.40 / 2.96 | 3.74 / 3.23 | 4.16 / 3.52 | 4.51 / 3.73 |
| 50 °C | 2.92 / 2.56 | 3.27 / 2.82 | 3.64 / 3.06 | 3.99 / 3.32 | 4.39 / 3.55 |
| 75 °C | 2.87 / 2.42 | 3.22 / 2.69 | 3.53 / 2.91 | 3.93 / 3.16 | 4.05 / 3.41 |
| 100 °C | 2.83 / 2.33 | 3.14 / 2.54 | 3.46 / 2.76 | 3.64 / 3.03 | 4.09 / 3.24 |
| 125 °C | 2.79 / 2.22 | 3.09 / 2.43 | 3.41 / 2.63 | 3.67 / 2.88 | 4.01 / 3.05 |
| | | | | | |
| 0 °C | 2.58 / 2.23 | 2.88 / 2.48 | 3.22 / 2.73 | 3.52 / 3.00 | 3.85 / 3.26 |
| 25 °C | 2.50 / 2.11 | 2.80 / 2.36 | 3.11 / 2.62 | 3.40 / 2.86 | 3.72 / 3.10 |
| 50 °C | 2.43 / 1.99 | 2.72 / 2.23 | 2.99 / 2.45 | 3.30 / 2.69 | 3.63 / 2.93 |
| 75 °C | 2.36 / 1.89 | 2.62 / 2.09 | 2.92 / 2.33 | 3.25 / 2.53 | 3.47 / 2.73 |
| 100 °C | 2.30 / 1.79 | 2.57 / 2.00 | 2.86 / 2.21 | 3.11 / 2.37 | 3.38 / 2.63 |
| 125 °C | 2.25 / 1.69 | 2.52 / 1.90 | 2.78 / 2.08 | 3.01 / 2.29 | 3.32 / 2.50 |
| | | | | | |
| 0 °C | 2.01 / 1.69 | 2.34 / 1.95 | 2.65 / 2.17 | 2.96 / 2.40 | 3.24 / 2.66 |
| 25 °C | 1.94 / 1.60 | 2.28 / 1.81 | 2.57 / 2.03 | 2.85 / 2.29 | 3.14 / 2.52 |
| 50 °C | 1.95 / 1.46 | 2.22 / 1.71 | 2.49 / 1.92 | 2.76 / 2.13 | 3.03 / 2.38 |
| 75 °C | 1.90 / 1.43 | 2.16 / 1.61 | 2.42 / 1.82 | 2.68 / 2.04 | 2.95 / 2.22 |
| 100 °C | 1.87 / 1.36 | 2.11 / 1.55 | 2.35 / 1.72 | 2.61 / 1.93 | 2.86 / 2.10 |
| 125 °C | 1.83 / 1.29 | 2.06 / 1.47 | 2.30 / 1.63 | 2.55 / 1.80 | 2.78 / 2.00 |

$SR_{rise} / SR_{fall}$ (V/nS)

FIG. 15

Normalized Supply Voltage

| | | | | | |
|---|---|---|---|---|---|
| 0 °C | 2.12 / 1.68 | 2.36 / 1.85 | 2.61 / 2.01 | 2.86 / 2.17 | 3.11 / 2.33 |
| 25 °C | 2.05 / 1.61 | 2.29 / 1.77 | 2.52 / 1.92 | 2.76 / 2.08 | 3.00 / 2.23 |
| 50 °C | 2.33 / 1.97 | 2.22 / 1.69 | 2.45 / 1.84 | 2.68 / 1.98 | 2.91 / 2.13 |
| 75 °C | 2.27 / 1.88 | 2.52 / 2.07 | 2.38 / 1.75 | 2.61 / 1.89 | 2.83 / 2.03 |
| 100 °C | 2.50 / 2.14 | 2.46 / 1.97 | 2.71 / 2.15 | 2.54 / 1.81 | 2.75 / 1.94 |
| 125 °C | 2.45 / 2.04 | 2.71 / 2.24 | 2.64 / 2.04 | 2.47 / 1.72 | 2.68 / 1.85 |
| 0 °C | 2.49 / 2.36 | 2.54 / 2.30 | 2.83 / 2.55 | 2.76 / 2.32 | 2.59 / 1.95 |
| 25 °C | 2.99 / 2.68 | 2.72 / 2.49 | 2.74 / 2.41 | 2.67 / 2.20 | 2.92 / 2.39 |
| 50 °C | 2.91 / 2.53 | 2.64 / 2.35 | 2.93 / 2.60 | 2.92 / 2.50 | 2.83 / 2.27 |
| 75 °C | 2.83 / 2.40 | 3.17 / 2.68 | 2.85 / 2.46 | 2.84 / 2.36 | 3.10 / 2.57 |
| 100 °C | 2.91 / 2.43 | 3.09 / 2.54 | 2.77 / 2.33 | 3.05 / 2.56 | 3.02 / 2.43 |
| 125 °C | 2.84 / 2.32 | 3.01 / 2.41 | 3.34 / 2.67 | 2.97 / 2.42 | 3.25 / 2.64 |
| 0 °C | 2.75 / 2.40 | 2.98 / 2.63 | 3.18 / 2.78 | 3.54 / 3.09 | 3.15 / 2.83 |
| 25 °C | 2.66 / 2.29 | 2.88 / 2.48 | 3.23 / 2.79 | 3.41 / 2.90 | 3.04 / 2.66 |
| 50 °C | 2.58 / 2.17 | 2.93 / 2.47 | 3.13 / 2.63 | 3.30 / 2.73 | 3.64 / 3.01 |
| 75 °C | 2.62 / 2.15 | 2.85 / 2.33 | 3.04 / 2.48 | 3.37 / 2.75 | 3.52 / 2.84 |
| 100 °C | 2.56 / 2.04 | 2.77 / 2.21 | 3.10 / 2.48 | 3.28 / 2.60 | 3.60 / 2.86 |
| 125 °C | 2.50 / 1.94 | 2.71 / 2.10 | 3.02 / 2.35 | 3.19 / 2.46 | 3.51 / 2.71 |

$SR_{rise} / SR_{fall}$ (V/nS)

FIG. 16

| Circuit Logic | Pull-High | Pull-Low |
|---|---|---|
| IN | 0 | 2xVDD |
| INL | 0 | VDD |
| INH | VDD | 2xVDD |
| Node A | 2xVDD | VDD |
| Node B | VDD | 0 |
| OUT | 2xVDD | 0 |
| MPP | ON | OFF |
| MPN | OFF | ON |
| MP | ON | OFF |
| MNN | OFF | ON |
| MNP | ON | OFF |
| MN | OFF | ON |

FIG. 17

| Circuit Logic | Pull-High | Pull-High | Pull-High | Pull-Low |
|---|---|---|---|---|
| (A, B) | (0, 0) | (0, 2xVDD) | (2xVDD, 0) | (2xVDD, 2xVDD) |
| (AL, BL) | (0, 0) | (0, VDD) | (VDD, 0) | (VDD, VDD) |
| (AH, BH) | (VDD, VDD) | (VDD, 2xVDD) | (2xVDD, VDD) | (2xVDD, 2xVDD) |
| Node A | 2xVDD | 2xVDD | 2xVDD | VDD |
| Node B | VDD | VDD | VDD | 0 |
| OUT | 2xVDD | 2xVDD | 2xVDD | 0 |
| MPP1 | ON | ON | OFF | OFF |
| MPP2 | ON | OFF | ON | OFF |
| MPN1 | OFF | OFF | ON | ON |
| MPN2 | OFF | OFF | OFF | ON |
| MP | ON | ON | ON | OFF |
| MNN1 | OFF | OFF | OFF | ON |
| MNN2 | OFF | ON | OFF | ON |
| MNP1 | ON | ON | OFF | OFF |
| MNP2 | ON | OFF | ON | OFF |
| MN | OFF | OFF | OFF | ON |

FIG. 18

| Circuit Logic | Pull-High | Pull-Low | Pull-Low | Pull-Low |
|---|---|---|---|---|
| (A, B) | (0, 0) | (0, 2xVDD) | (2xVDD, 0) | (2xVDD, 2xVDD) |
| (AL, BL) | (0, 0) | (0, VDD) | (VDD, 0) | (VDD, VDD) |
| (AH, BH) | (VDD, VDD) | (VDD, 2xVDD) | (2xVDD, VDD) | (2xVDD, 2xVDD) |
| Node A | 2xVDD | VDD | VDD | VDD |
| Node B | VDD | 0 | 0 | 0 |
| OUT | 2xVDD | 0 | 0 | 0 |
| MPP1 | ON | ON | OFF | OFF |
| MPP2 | ON | OFF | OFF | OFF |
| MPN1 | OFF | OFF | ON | ON |
| MPN2 | OFF | ON | OFF | ON |
| MP | ON | OFF | OFF | OFF |
| MNN1 | OFF | OFF | ON | ON |
| MNN2 | OFF | ON | OFF | ON |
| MNP1 | ON | OFF | OFF | OFF |
| MNP2 | ON | OFF | ON | OFF |
| MN | OFF | ON | ON | ON |

FIG. 19

2×VDD-TOLERANT LOGIC CIRCUITS AND A RELATED 2×VDD-TOLERANT I/O BUFFER WITH PVT COMPENSATION

FIELD OF THE INVENTION

The present invention relates generally to 2×VDD voltage-tolerant logic. More particularly, the present invention discloses a 2×VDD-tolerant I/O buffer circuit with process, voltage, and temperature (PVT) compensation.

BACKGROUND OF THE INVENTION

With the recent trend for high-speed interfaces, the sensitivity of circuits towards process, voltage and temperature (PVT) variation is hampering both circuit performance and yields. For example, in the case of input/output (I/O) pads, it is difficult to meet the rise and fall times, current, power, and ground bounce specifications across all PVT corners. See Qadeer A. Khan, G. K. Siddhartha, Divya Tripathi, Sanjay Kumar Wadhwa, Kulbhushan Misri, "Techniques for on-chip process voltage and temperature detection and compensation," in Proc. IEEE Int. Conference on VLSI Design (VL-SID), p. 6, 2006. Driver circuits are oversized to meet timing at slow corners. This causes high current and simultaneous switching noise (SSN) at fast corners. Such effects degrade the reliability of the circuit and require considerable amount of design resources and time to meet circuit performance criteria across PVT variations. To overcome these problems, several inventions concerning PVT compensation may keep the output slew rates within a small range. See, e.g., Dong-Suk Shin, Inhwa Jung, Chulwoo Kim, Hyung-Dong Lee, and Young-Jung Choi, "Impedence-controlled pseudo-open drain output driver circuit and method for driving the same," U.S. Pat. No. 7,579,861, Aug. 25, 2009; Mel Bazes, "Speed-locked loop to provide speed information based on die operating conditions," U.S. Pat. No. 7,123,066, Oct. 17, 2006; Qadeer A. Khan, Sanjay K Wadhwa, Divya Tripathi, Siddhartha Gk, and Kulbhushan Misri, "PVT variation detection and compensation circuit," U.S. Pat. No. 7,495,465, Feb. 24, 2009; the contents of all of which are incorporated herein by reference. These inventions, however, have not been applied in the area of mixed-voltage I/O circuits.

Accordingly, there is an immediate need for improved 2×VDD voltage tolerant logic, and in particular 2×VDD voltage tolerant I/O buffers with process, voltage and temperature (PVT) compensation.

SUMMARY

The present invention overcomes the drawbacks of the prior art. The present invention discloses 2×VDD tolerant logic and an I/O buffer that employs the same.

One embodiment discloses a logic circuit for performing a logic operation on at least one input signal and generating at least a corresponding output signal. The logic circuit includes a level converter that converts the input signal into a corresponding first signal that is in a first voltage range and a second signal that is in a second voltage range. The second voltage range has a higher operating voltage than the first voltage range. The logic circuit also includes a pull-low logic path that performs the logic operation; the pull-low logic path accepts as input the first signal and generates a first output that is in the first voltage range. The logic circuit further includes a pull-high logic path that also performs the logic operation; the pull-high logic path accepts as input the second signal and generates a second output in the second voltage range. Finally, the logic circuit includes an output stage that accepts the first output and the second output to generate the output of the logic circuit; the operating voltage of the output signal spans the first voltage range and the second voltage range.

In preferred embodiments the highest voltage in the first voltage range is functionally equal to the lowest voltage in the second voltage range. In particularly preferred embodiments the first voltage range is from 0 volts to VDD, and the second voltage range is from VDD to 2×VDD.

In various embodiments the output stage comprises a first transistor with a first terminal electrically connected to the first output, and a second transistor with a first terminal electrically connected to the second output; wherein second terminals of the first transistor and the second transistor are electrically connected together to provide the output signal. In particular embodiments the bulk terminal of the first transistor is electrically connected to functionally the lowest voltage in the first voltage range, and the bulk terminal of the second transistor is electrically connected to functionally the highest voltage of the second voltage range; the first and second transistors are of opposite electrical types, and gates of the first transistor and the second transistor are electrically connected to a voltage that is functionally equivalent to the highest voltage of the first voltage range.

In one specific embodiment the logic operation is a logical NOT operation. The pull-low logic path comprises a third transistor and a fourth transistor of opposite electrical types. The gates of the third transistor and the fourth transistor are electrically connected to the first signal, and first terminals of the third transistor and the fourth transistor are respectively electrically connected to functionally the lowest voltage in the first voltage range and the second voltage range, while second terminals of each of the third and fourth transistors are electrically connected together to provide the first output. The pull-high logic path also comprises a fifth transistor and a sixth transistor of opposite electrical types. The gates of the fifth transistor and the sixth transistor are electrically connected to the second signal. First terminals of the fifth transistor and the sixth transistor are respectively electrically connected to functionally the highest voltage in the first voltage range and the second voltage range, and second terminals of each of the fifth and sixth transistors are electrically connected together to provide the second output.

In another specific embodiment the logic operation is a logical NAND operation having at least two inputs. The logic circuit has at least two corresponding level converters for the at least two inputs to provide a corresponding plurality of first signals and second signals. The pull-low logic path comprises a plurality of transistors configured to perform a NAND logical operation in the first voltage range utilizing the plurality of first signals as gate inputs. The pull-high logic path comprises a plurality of transistors configured to perform a NAND logical operation in the second voltage range utilizing the plurality of second signals as gate inputs.

In yet another specific embodiment the logic operation is a logical NOR operation having at least two inputs. The logic circuit has at least two corresponding level converters for the at least two inputs to provide a corresponding plurality of first signals and second signals. The pull-low logic path comprises a plurality of transistors configured to perform a NOR logical operation in the first voltage range utilizing the plurality of first signals as gate inputs. Similarly, the pull-high logic path comprises a plurality of transistors configured to perform a NOR logical operation in the second voltage range utilizing the plurality of second signals as gate inputs.

In another aspect a 2×VDD tolerant I/O buffer employing embodiment 2×VDD tolerant logic is disclosed.

DESCRIPTION OF THE DRAWINGS

FIG. 14 shows a truth table for an embodiment 8-to-3 encoder.

FIG. 15 shows simulated output slew rates of an embodiment 2×VDD-tolerant I/O buffer without PVT compensation.

FIG. 16 shows simulated output slew rates of an embodiment 2×VDD-tolerant I/O buffer with PVT compensation using a 3-bit control signal.

FIG. 17 shows a logic table for circuit elements of the inverter.

FIG. 18 shows a logic table for the circuit elements of the NAND gate.

FIG. 19 shows another logic table for the circuit elements of the NAND gate.

DETAILED DESCRIPTION OF THE INVENTION

Figure 1:
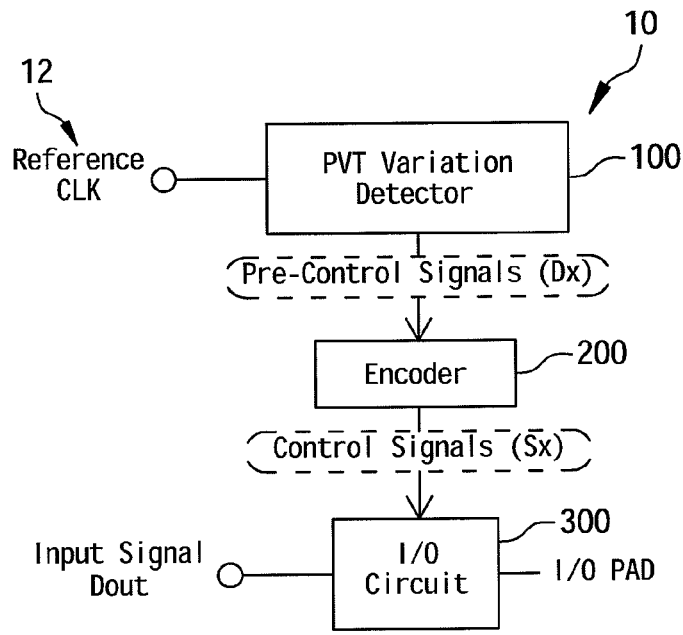
FIG. 1 is a block diagram of an input/output (I/O) circuit with PVT compensation.

Various preferred embodiments disclose a 2×VDD-tolerant input/output (I/O) buffer circuit with process, voltage and temperature (PVT) compensation to provide output slew rates within a small range. FIG. 1 shows a circuit design 10 employing a PVT compensation technique to keep the output slew rate of an I/O buffer within a small range. The circuit 10 includes a PVT variation detector 100, an encoder 200, and an I/O circuit 300. As shown in FIG. 1, the PVT variation detector 100 detects process, voltage, and temperature variations by sensing a reference clock 12 under different conditions. Then the PVT variation detector 100 generates and provides corresponding pre-control signals Dx to the encoder 200. The pre-control signals Dx are encoded into control signals Sx by the encoder 200. The control signals Sx determine the driving capacities of the I/O circuit 300.

Figure 2:
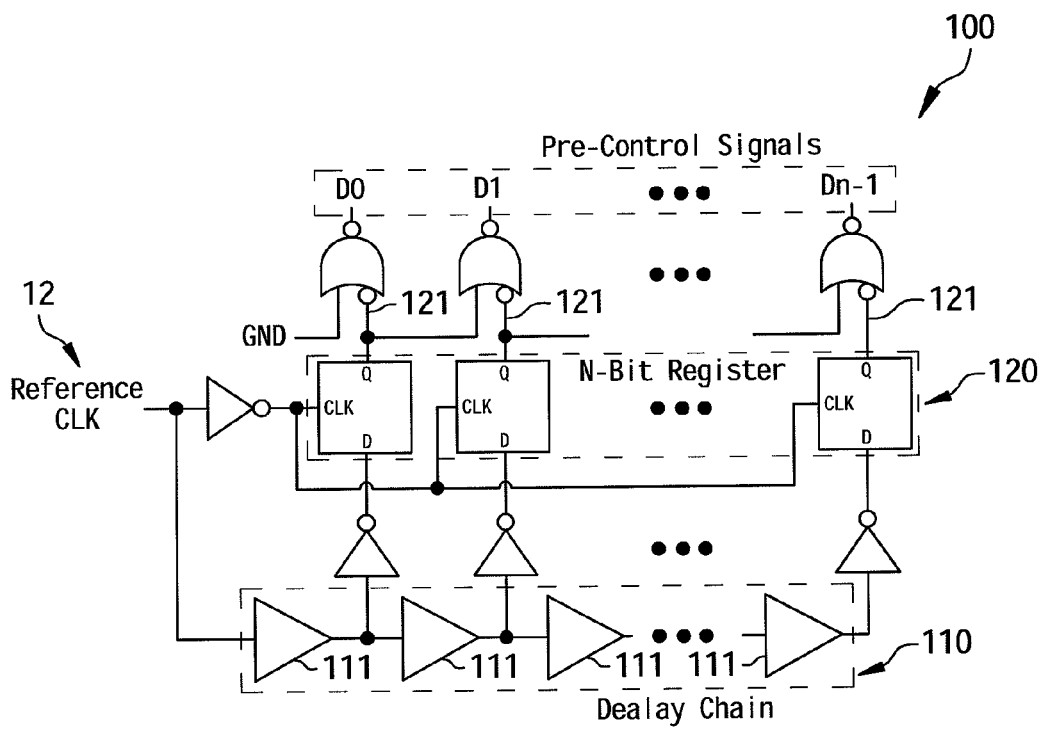
FIG. 2 is a circuit diagram of the PVT variation detector shown in FIG. 1.

An embodiment of the PVT variation detector 100 is shown in FIG. 2. Initially, the reference clock 12 delivers a high logic signal into the delay chain 110. Then, once the reference clock 12 transitions into a low logic signal the outputs of each delay cell 111 in the delay chain 110 are loaded into an N-bit register 120. The outputs 121 of the N-bit register 120 are encoded into pre-control signals D0~Dn−1. Because the propagation delay in the delay chain 110 depends upon the process, voltage, and temperature, it will result in different values of D1~Dn−1 for different PVT conditions. The pre-control signals D0~Dn−1 are then encoded into the control signals Sx. The control signals Sx are used to adjust the driving capacities of the I/O circuit 300. As a result the output slew rate of an I/O buffer can be kept within a small range.

The above PVT compensation technique has been used only in a conventional I/O circuit. For 2×VDD-tolerant applications, new 2×VDD-tolerant logic gates are disclosed in the following that may be used in the PVT compensation circuit 100. A 2×VDD-tolerant I/O buffer with such a PVT compensation circuit 100 can keep the output slew rate within a small range.

A. 2×VDD-Tolerant Logic Gates

Figure 3:
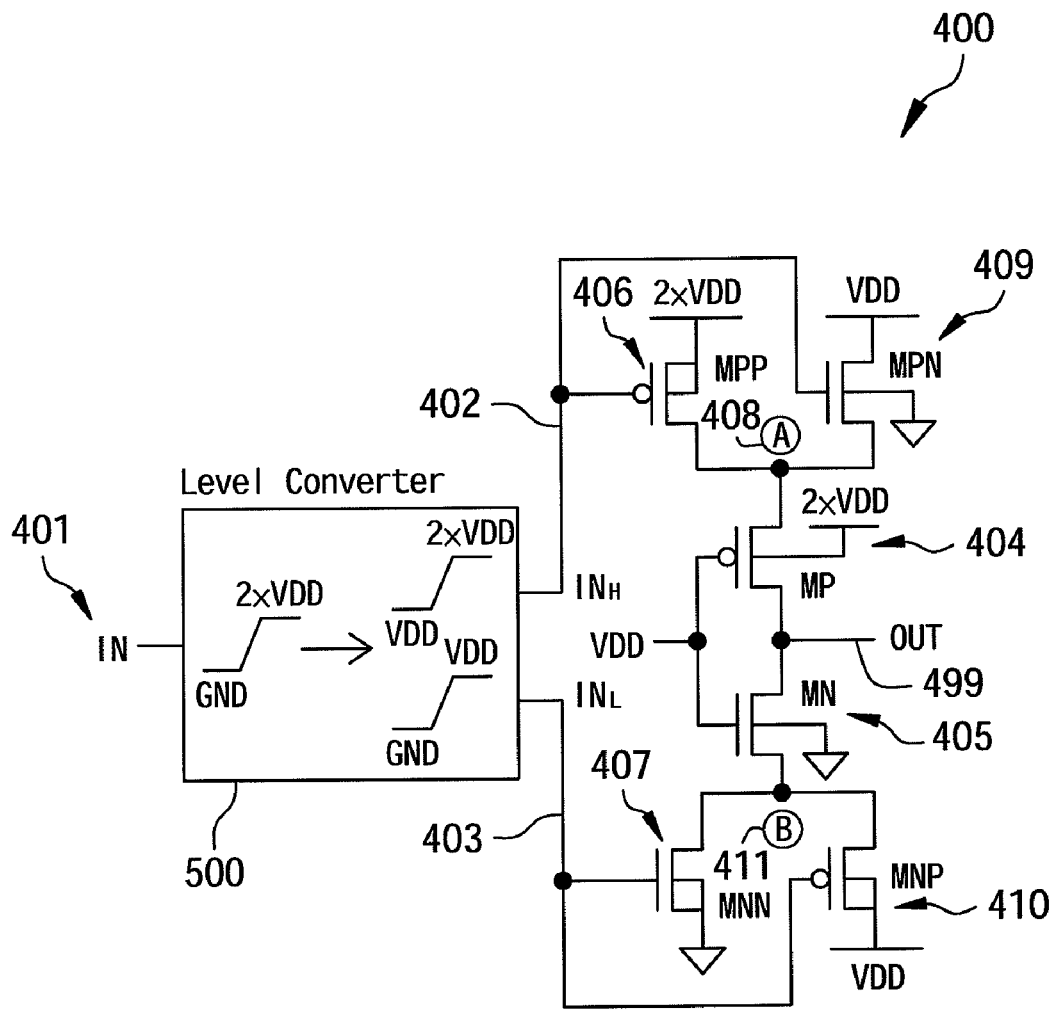
FIG. 3 is a circuit diagram of an embodiment 2×VDD-tolerant inverter.

In order to detect the variation of a 2×VDD power line, the logic gates used in the PVT compensation circuit 100 should have a 2×VDD-tolerant structure. The input/output voltage swings of 2×VDD-tolerant logic gates are from 0V to two times the VDD voltage, i.e., twice the supply voltage. A 2×VDD-tolerant inverter 400 is shown in FIG. 3 that performs a logical NOT operation. The voltage swing of the input IN 401 is from 0V to 2×VDD—that is, from zero volts to twice the supply voltage VDD. To control the output transistors, level converter 500 converts the input IN 401 to INH 402 and INL 403. The voltage swings of INH 402 and INL 403 are from VDD to 2×VDD and from 0V to VDD, respectively. The level converter 500 thus takes an input logic signal IN 401 and converts this signal into two corresponding output logic signals that include a first signal INL 403 that is within a first voltage range (i.e., 0 to VDD) and a second signal INH 402 that is in a second voltage range (i.e., VDD to 2×VDD).

The inverter 400 may be broadly viewed as having a pull-high path that accepts as input the second signal INH 402 from the level converter 500, a pull-low path that accepts as input the first signal INL 403 from the level converter 500, and an output stage provided by transistors MP 404 and MN 405. The pull-high path thus operates in the second voltage range, while the pull-low path operates in the first voltage range. The output stage uses the outputs from the pull-high path and the pull-low path to generate an output signal OUT 499 of the inverter 400 that is in a voltage range from 0 to 2×VDD, i.e., which thus spans across the first and second voltage ranges. Hence, the operating voltage of the inverter 400, both input and output, spans the first and second voltage ranges.

As shown in FIG. 3, the transistors MP 404 and MN 405 are used to transmit or drive function logic output OUT 499 and prevent gate-oxide overstress of the logic gate 400. Transistor MP 404 may be of a first electrical type that is preferably PMOS, while transistor MN 405 may be of a second electrical type that is preferably NMOS. When the 2×VDD-tolerant inverter 400 is pulled up to a logic high by the pull-high path, the transistor MP 404, the gate for which is biased at 1×VDD, can successfully drive the OUT signal 499 to 2×VDD. On the other hand, in the pull-low path, the transistor MN 405, the gate of which is also biased at 1×VDD, can successfully drive the OUT signal 499 to 0 (GND). Moreover, with the stacked structure formed by transistors MP 404 and MN 405, each path will not be at a voltage that is over 1×VDD and thus avoids gate-oxide overstress issues. The bulk terminal for transistor MP 404 is tied to 2×VDD, and the bulk terminal of transistor MN 405 is tied to ground. The source terminals of transistors MP 404 and MN 405 are respectively connected to the outputs of the pull-high path and the pull-low path, while the drains of the transistors MP 404 and MN 405 are tied together for the output signal OUT 499.

The transistors MPP 406 and MNN 407 determine and provide the inverter function. Transistor MPP 406 may be of the first electrical type, preferably PMOS, while transistor MNN 407 may be of a second electrical type, preferably NMOS. To ensure the voltage level at node A 408 is at a safe state, the transistor MPN 409, which may be of a second electrical type such as NMOS, provides a voltage level of VDD to node A 408 when the pull-high path is off. Similarly, the transistor MNP 410, which may of the first electrical type such as PMOS, provides a voltage level of VDD to node B 411 when the pull-low path is off. FIG. 17 shows a logic table for circuit elements of the inverter 400.

Figure 4:
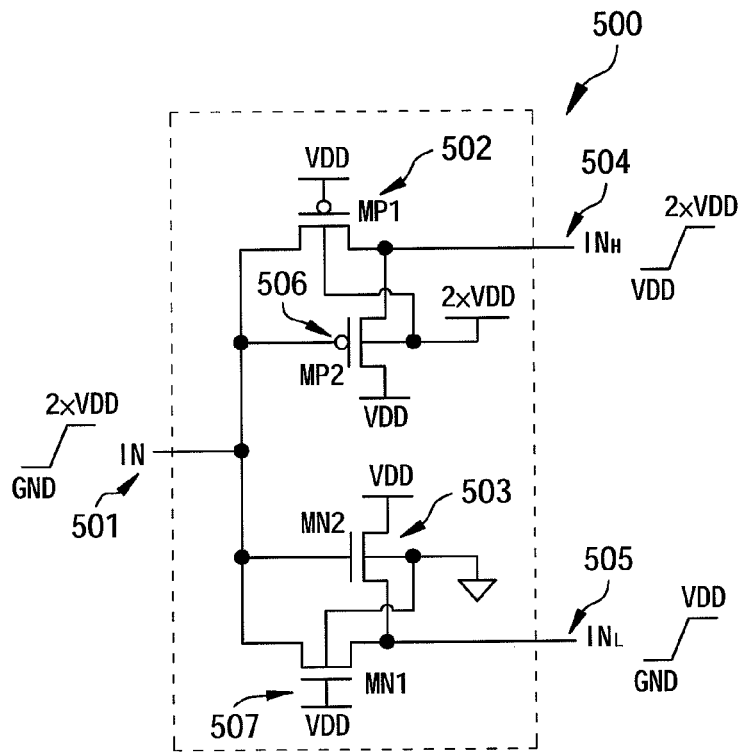
FIG. 4 is a circuit diagram of an embodiment level converter used in 2×VDD-tolerant logic gates.

An embodiment of the level converter 500 used in the 2×VDD-tolerant inverter 400 is shown in FIG. 4. When IN 501 is 2×VDD, the transistors MP1 502 and MN2 503 are turned on, and so INH 504 is 2×VDD and INL 505 is VDD. When IN 501 is 0V, the transistors MP2 506 and MN1 507 are turned on, and so INH 504 is VDD and INL 505 is 0V. Transistors MP1 502 and MP2 506 may be of the first electrical type, preferably PMOS, and transistors MN2 503 and MN1 507 may be of a second electrical type, preferably NMOS.

Figure 5:
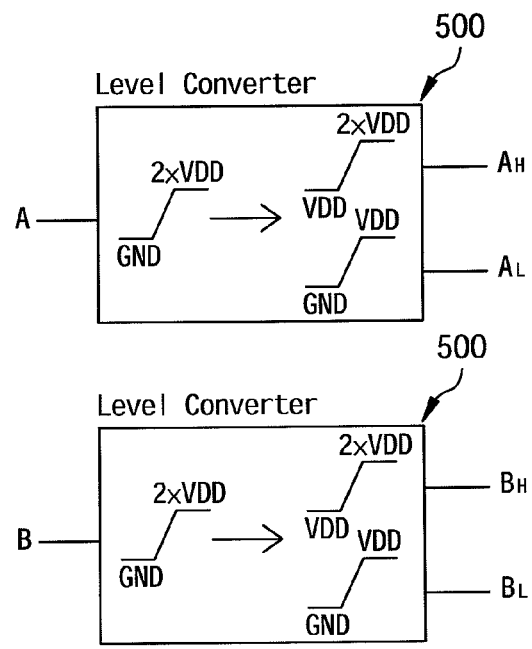
FIG. 5 illustrates input signals of 2-input 2×VDD-tolerant logic gates.
Figure 6:
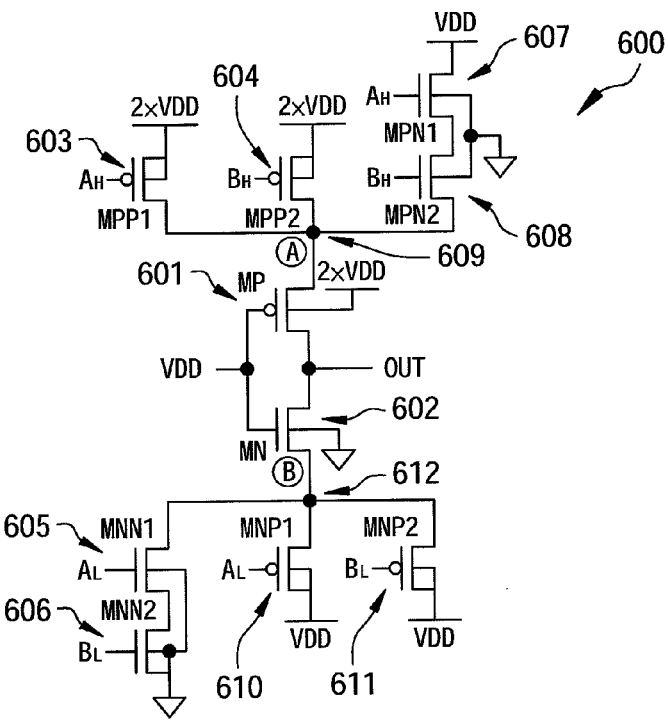
FIG. 6 is a circuit diagram of embodiment 2-input 2×VDD-tolerant NAND gates.
Figure 7:
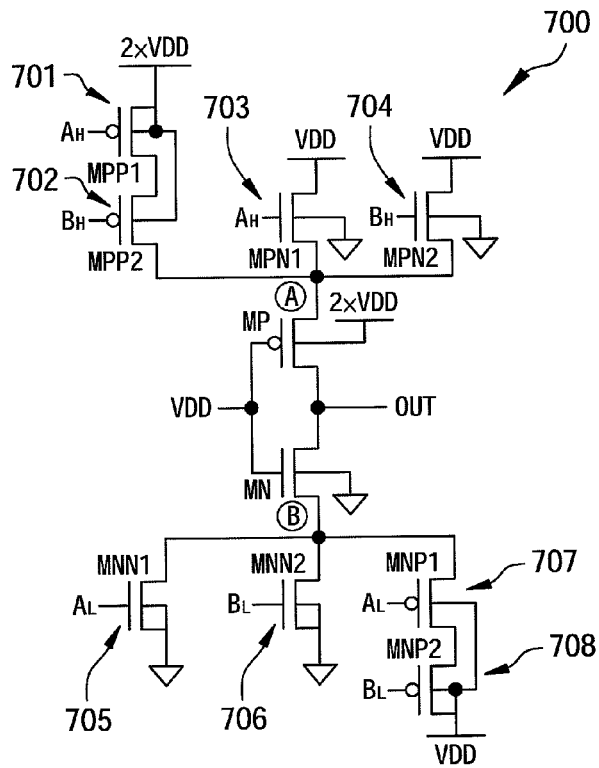
FIG. 7 is a circuit diagram of embodiment 2-input 2×VDD-tolerant NOR gates.

FIG. 5 to FIG. 7 show embodiments of a 2-input 2×VDD-tolerant NAND gate 600 and NOR gate 700 that perform the logical NAND and NOR operations, respectively. As shown in FIG. 5, inputs A and B, which are from 0 volts to 2×VDD, are converted to AH, AL, BH, and BL by respective level converters 500 shown in FIG. 4, which may then be supplied to the logic gates 600 and 700 as discussed in the following and shown in the related figures.

FIG. 6 shows an embodiment 2-input 2×VDD-tolerant NAND gate 600. Transistors MP 601 and MN 602 are used to protect the logic gate 600 from gate-oxide overstress, in a manner analogous to that discussed above in reference to inverter 400. The NAND gate 600 may be broadly view as having a pull-high path that accepts the inputs AH and BH, a pull-low path that accepts the inputs AL and BL, and an output stage provided by the transistors MP 601 and MN 602. The transistors MPP1 603, MPP2 604, MNN1 605, and MNN2 606 determine and provide the NAND gate 600 functionality. The pull-high path may be viewed as a NAND gate that operates in the VDD to 2×VDD voltage range, generating an output at node A 609. Similarly, the pull-low path may be viewed as a NAND gate that operates in the 0 to VDD voltage range, generating an output at node B 612.

The transistors MPN1 607 and MPN2 608 provide a voltage level of VDD to node A 609 when the pull-high path is off. Similarly, the transistors MNP1 610 and MNP2 611 provide a voltage level of VDD to node B 612 when the pull-low path is off. Note that transistors MPP1 603 and MPP2 604 are in parallel, while transistors MPN1 607 and MPN2 608 are in series. Transistors MNN1 605 and MNN2 606 are in series, while transistors MNP1 610 and MNP2 611 are in parallel. FIG. 18 shows a logic table for the circuit elements of the NAND gate 600.

An embodiment 2-input 2×VDD-tolerant NOR gate 700 is shown in FIG. 7. In the 2-input 2×VDD-tolerant NOR gate 700, transistors MPP1 701 and MPP2 702 are in series, and so the transistors MPN1 703 and MPN2 704 are in parallel. The transistors MNN1 705 and MNN2 706 are in parallel, and so the transistors MNP1 707 and MNP2 708 are in series. The NOR gate 700 is analogous to the NAND gate 600. FIG. 19 shows a logic table for the circuit elements of the NAND gate 600.

Figure 8:
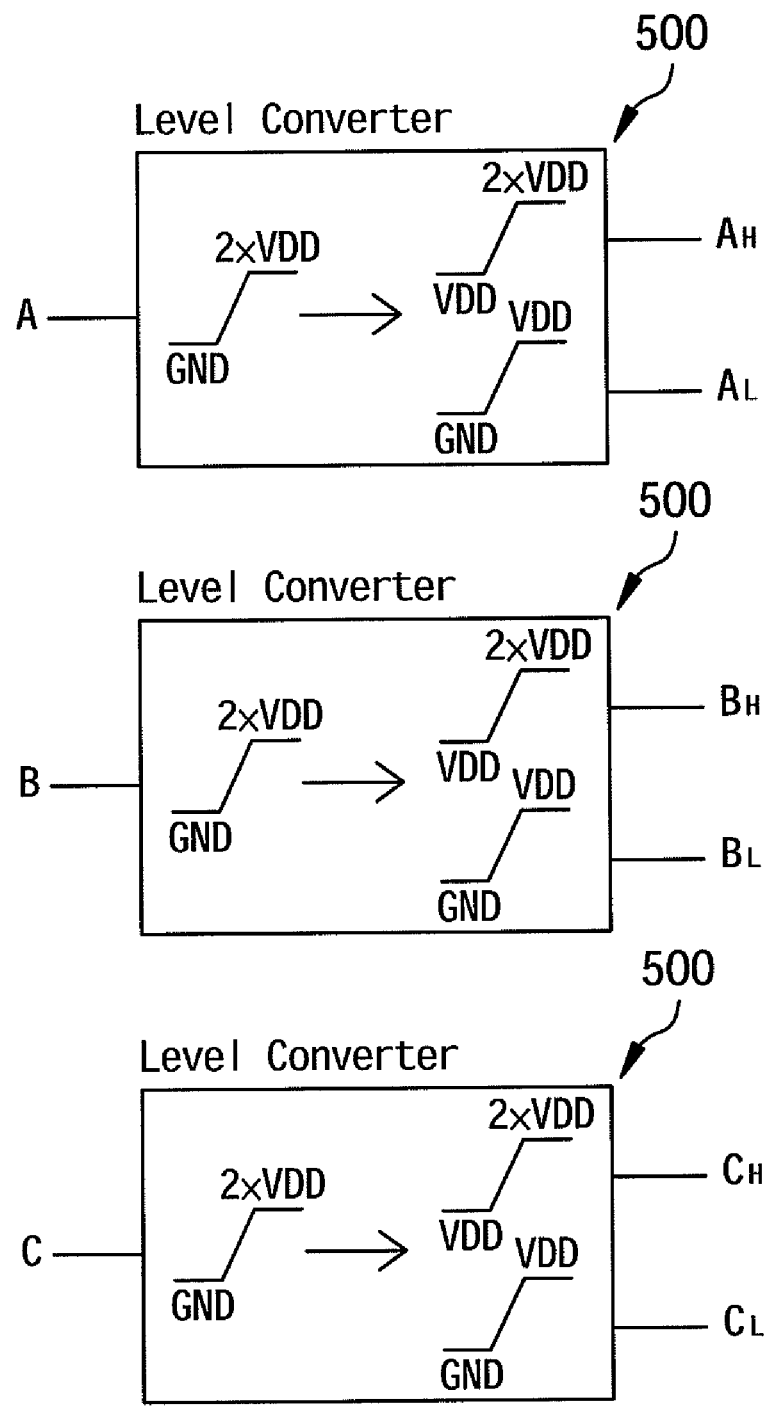
FIG. 8 illustrates input signals of embodiment 3-input 2×VDD-tolerant logic gates.
Figure 9:
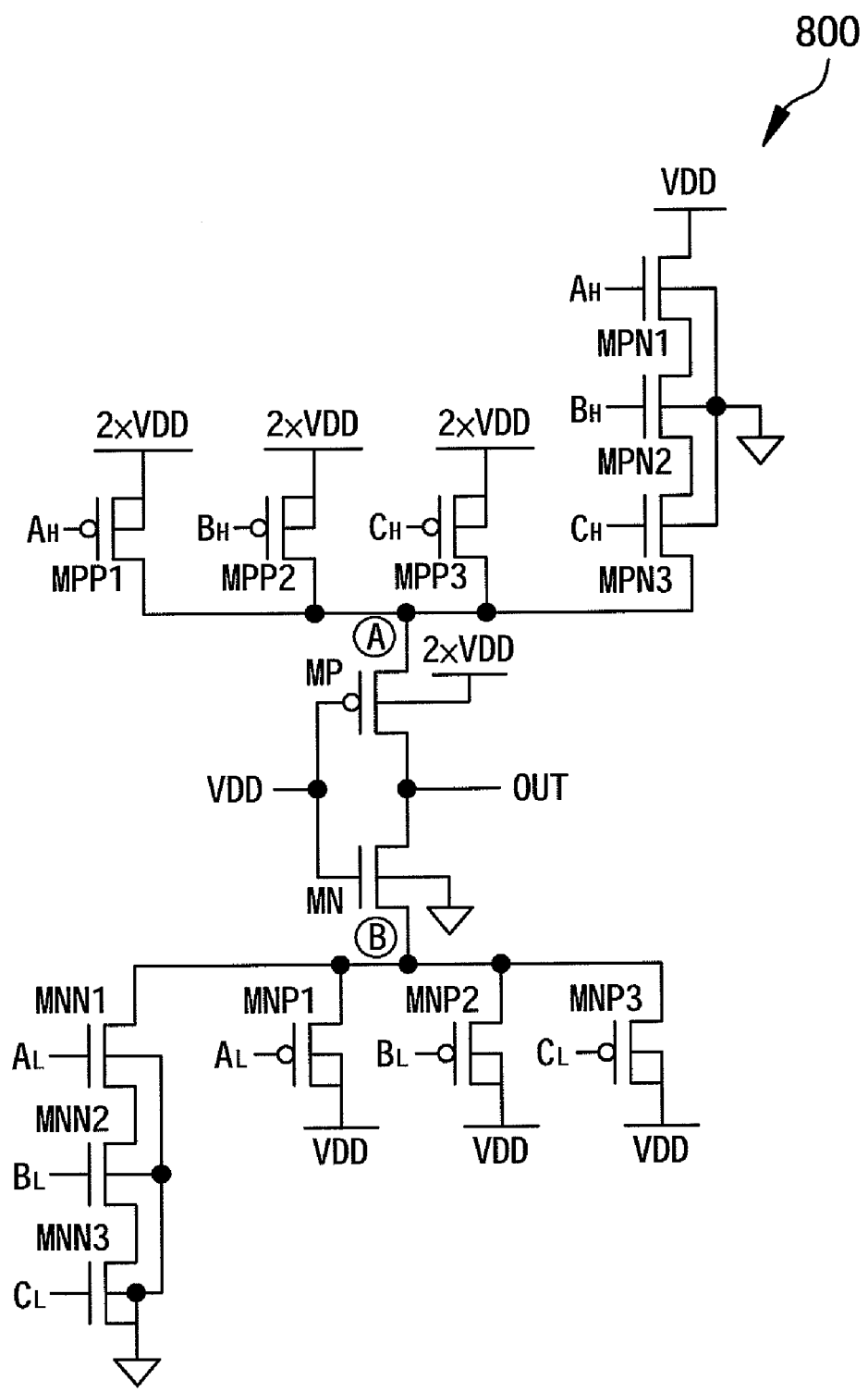
FIG. 9 is a circuit diagram of embodiment 3-input 2×VDD-tolerant NAND gates.
Figure 10:
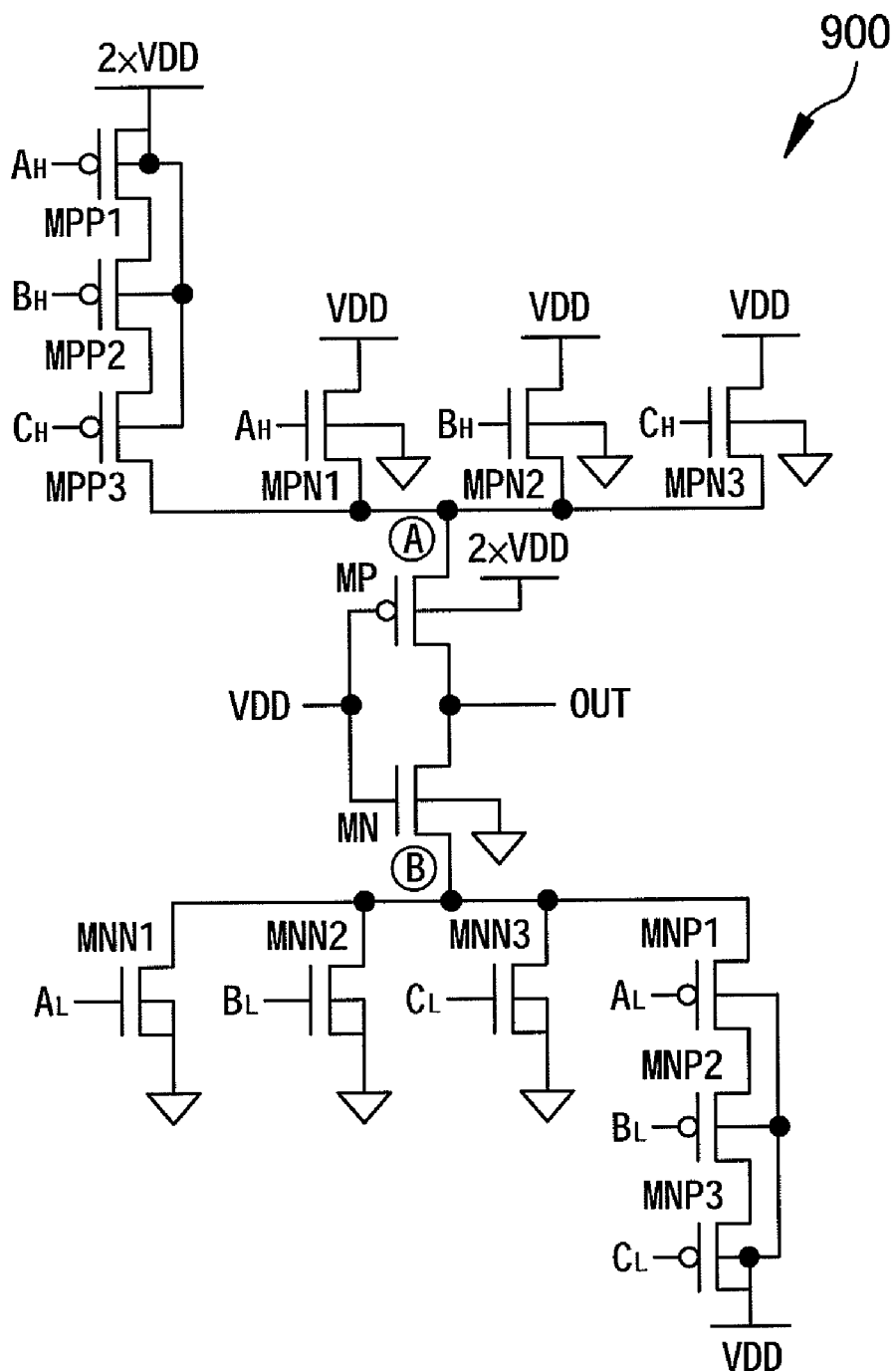
FIG. 10 is a circuit diagram of embodiment 3-input 2×VDD-tolerant NOR gates.

Embodiments of a 3-input 2×VDD-tolerant NAND gate 800 and NOR gate 900 are shown in FIG. 8 to FIG. 10. These 2×VDD-tolerant logic gates 600-900 may be used in a PVT compensation circuit to detect variation of a 2×VDD power line in a mixed-voltage I/O circuit.

B. 2×VDD-Tolerant I/O Buffer with PVT Compensation

Figure 11:
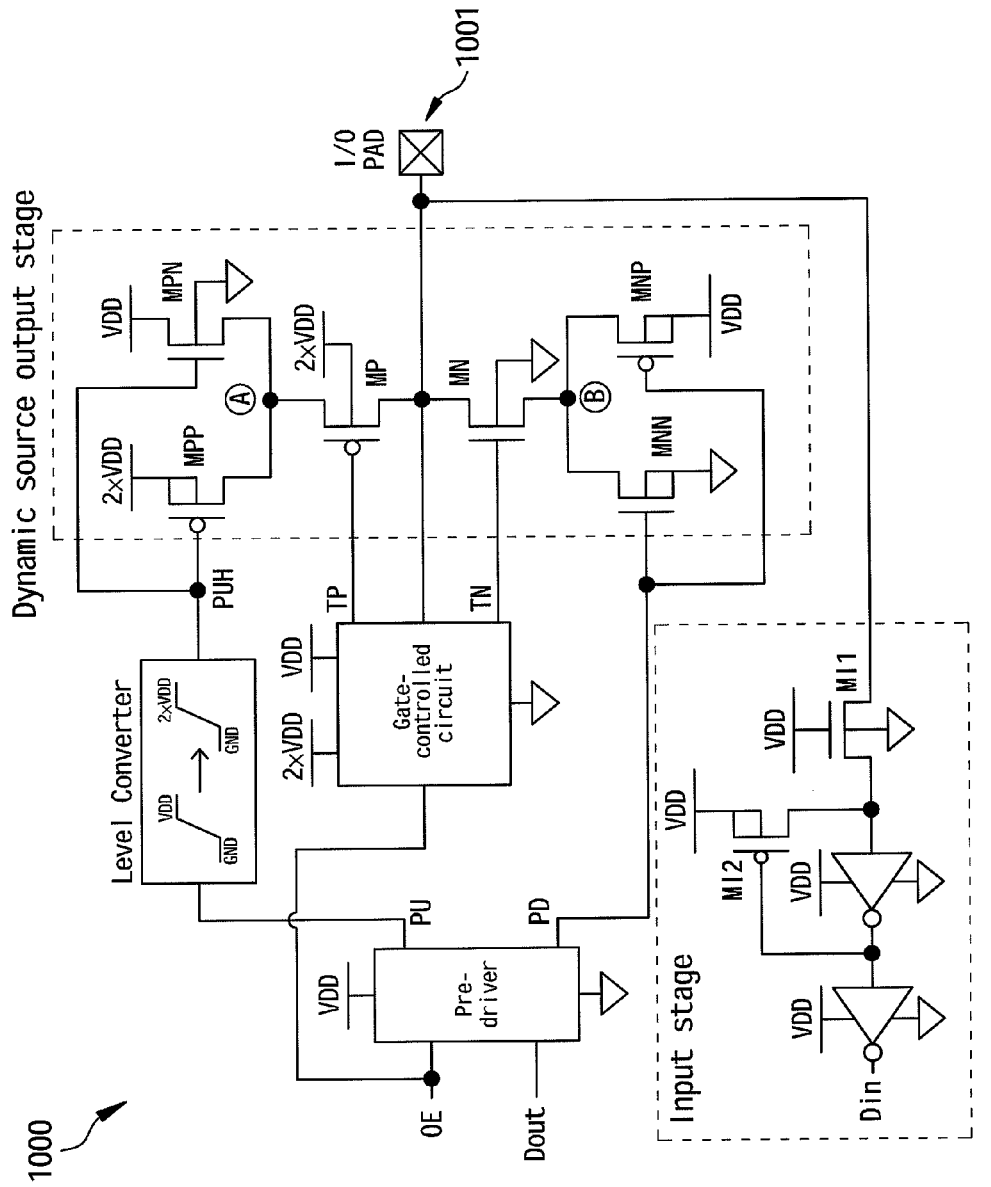
FIG. 11 is a circuit diagram of an embodiment 2×VDD-tolerant I/O buffer.
Figure 12:
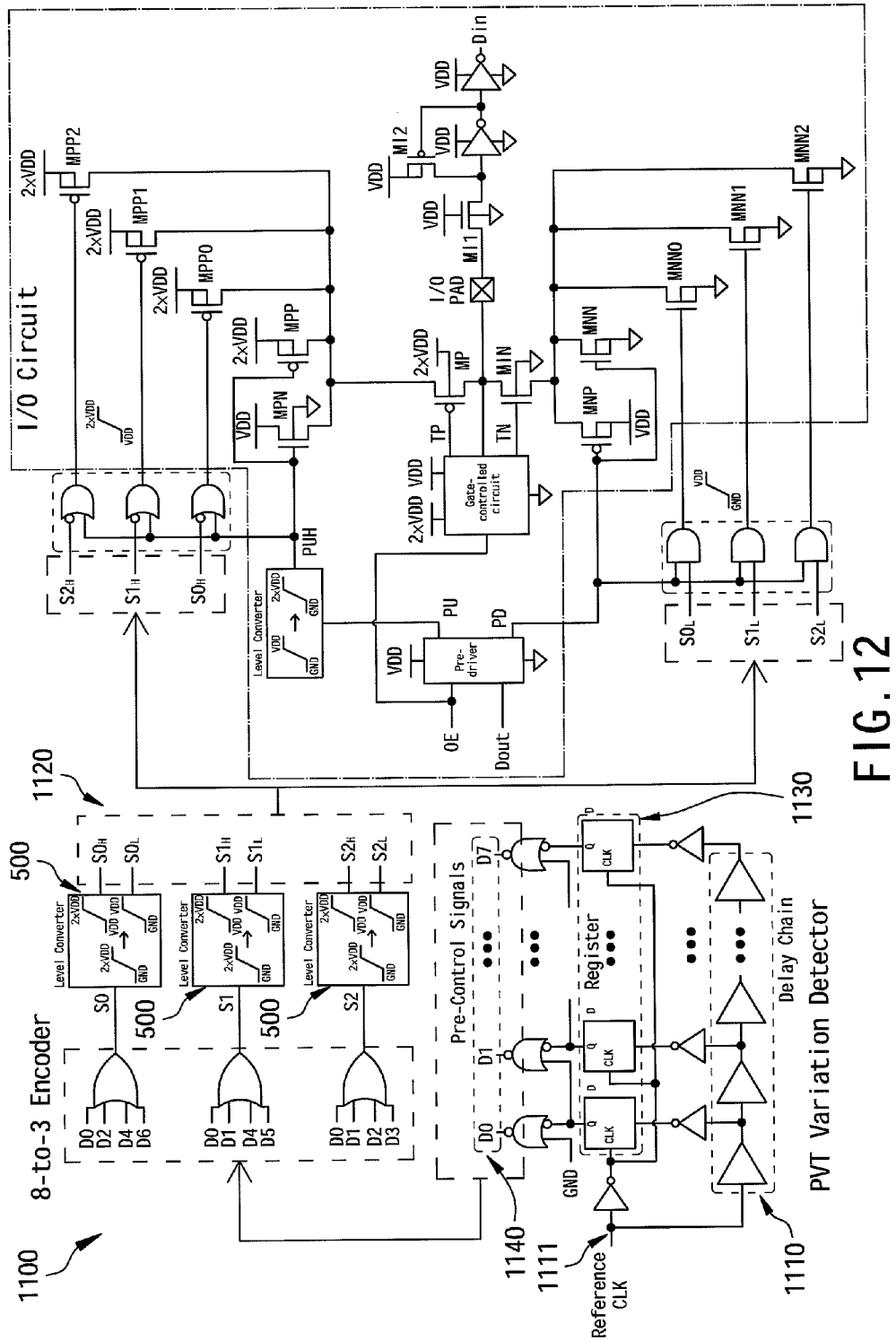
FIG. 12 is a circuit diagram of an embodiment 3-bit control signal 2×VDD-tolerant I/O buffer with PVT compensation.
Figure 13:
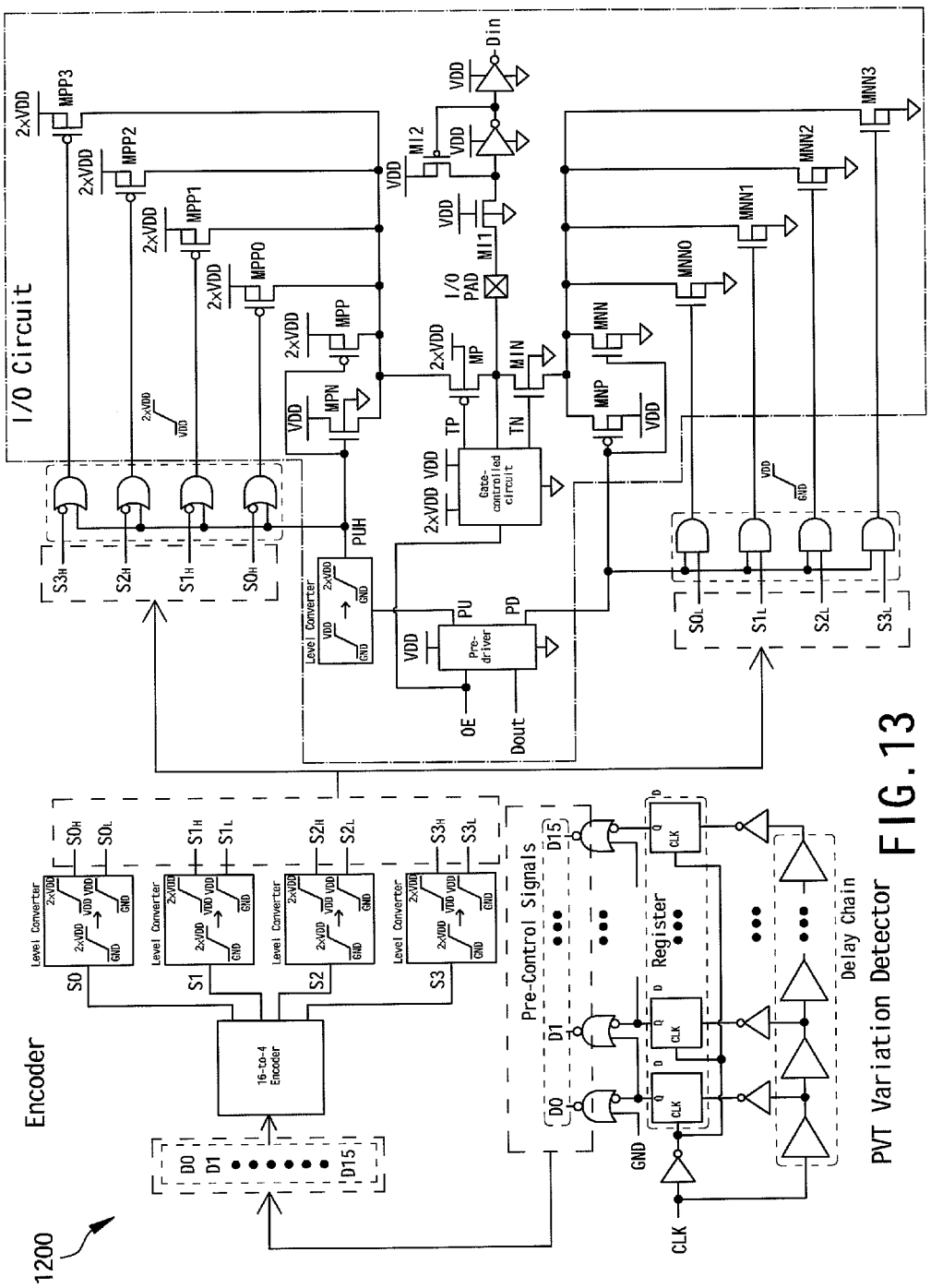
FIG. 13 is a circuit diagram of an embodiment 4-bit control signal 2×VDD-tolerant I/O buffer with PVT compensation.

FIG. 11 shows an embodiment 2×VDD-tolerant I/O buffer 1000 that can transmit and receive 2×VDD signals. To conform the output slew rate at the I/O PAD 1001 against PVT variations, the 2×VDD-tolerant I/O buffer 1000 includes a PVT compensation circuit. FIG. 12 shows a 3-bit control signal embodiment 1100 for a 2×VDD-tolerant I/O buffer with PVT compensation. As shown in FIG. 12, the logic gates used in the PVT variation detector 1110 and the encoder 1120 are all implemented with embodiment 2×VDD-tolerent logic gates 400-900, including the delay chain 1110, encoder 1120, register 1130, and pre-control signal logic 1140. However, the logic gates that accept the signals S0H, S1H, S2H, S0L, S1L, and S2L may be standard gates. The PVT variation detector 1110 senses the reference clock CLK 1111 to generate 8-bit pre-control signals D0 to D7. The 8-bit pre-control signals D0~D7 are encoded to 3-bit control signals S0 to S2 via a 8-to-3 encoder. The control signals S0~S2 are binary codes. The corresponding embodiment truth table is shown in FIG. 14 for converting the pre-control signals D0 to D7 to the control signals S0~S2. In order to combine the PVT compensation circuit with the 2×VDD-tolerant I/O buffer, the control signals S0~S2 are converted to S0H to S2H and S0L to S2L by respective level converters 500. The voltage swings of S0H~S2H and S0L~S2L are from VDD to 2×VDD and from 0V to VDD, respectively. The signals S0H~S2H and S0L~S2L with the OR gates and the AND gates may determine the on/off states of output transistors MPP0~MPP2 and MNN0~MNN2. Under slower conditions, the control signals S0 to S2 cause more output transistors (MPP0~MPP2 and MNN0~MNN2) to be turned on, whereas under faster conditions the control signals S0~S2 cause fewer or no output transistors (MPP0~MPP2 and MNN0~MNN2) to be turned on. For example, if the PVT detector generates a signal S0 to S2 that is 111, this indicates that the circuit may operate in the slowest condition. So, MPP0~MPP2 and MNN0~MNN2 will be turned on by the control signal S0~S2 to enhance the circuit driving ability. In contrast, if the PVT detector generates a signal S0 to S2 that is 000, this indicates that the circuit is operating in the fastest condition. Thus, there are no transistors that are turned on to enhance the driving capabilities. Therefore, the driving capacity of the 2×VDD-tolerant I/O buffer 1100 can be adjusted to match the underlying PVT variations of the circuit.

What is claimed is:

1. A 2×VDD tolerant logic circuit for performing a logic operation on at least an input signal and generating at least a corresponding output signal, the logic circuit comprising:
   a level converter for converting the at least an input signal into at least a corresponding first signal in a first voltage range and at least a second signal in a second voltage range, the second voltage range having a higher voltage than the first voltage range;
   a pull-low logic path for performing at least a portion of the logic operation of the logic circuit, the pull-low logic path accepting as input the at least a first signal and generating a first output in the first voltage range;
   a pull-high logic path for performing at least a portion of the logic operation of the logic circuit, the pull-high logic path accepting as input the at least a second signal and generating a second output in the second voltage range; and
   an output stage for accepting the first output and the second output to generate the output of the logic circuit, the operating voltage of the output including the first voltage range and the second voltage range, wherein the highest voltage of the first voltage range is functionally equal to the lowest voltage of the second voltage range, wherein the output stage comprises a first transistor with a first terminal electrically connected to the first output, and a second transistor with a first terminal electrically connected to the second output; wherein second terminals of the first transistor and the second transistor are electrically connected together to provide an output signal, wherein a bulk terminal of the first transistor is electrically connected to functionally the lowest voltage in the first voltage range, and a bulk terminal of the second transistor is electrically connected to functionally the highest voltage of the second voltage range; wherein the first and second transistors are of opposite electrical types, and gates of the first transistor and the second transistor are electrically connected to a voltage functionally equivalent to the highest voltage of the first voltage range.

2. The logic circuit of claim 1, wherein the logic operation is a logical NOT operation, wherein:

the pull-low logic path comprises a third transistor and a fourth transistor of opposite electrical types, the gates of the third transistor and the fourth transistor electrically connected to the first signal, first terminals of the third transistor and the fourth transistor respectively electrically connected to functionally the lowest voltage in the first voltage range and the second voltage range, and second terminals of each of the third and fourth transistors electrically connected together to provide the first output; and the pull-high logic path comprises a fifth transistor and a sixth transistor of opposite electrical types, the gates of the fifth transistor and the sixth transistor electrically connected to the second signal, first terminals of the fifth transistor and the sixth transistor respectively electrically connected to functionally the highest voltage in the first voltage range and the second voltage range, and second terminals of each of the fifth and sixth transistors electrically connected together to provide the second output.

3. The logic circuit of claim 1, wherein the logic operation is a logical NAND operation having at least two inputs, the logic circuit having at least two corresponding level converters for the at least two inputs to provide a corresponding plurality of first signals and second signals, wherein:

the pull-low logic path comprises a plurality of transistors configured to perform a NAND logical operation in the first voltage range utilizing the plurality of first signals as gate inputs; and the pull-high logic path comprises a plurality of transistors configured to perform a NAND logical operation in the second voltage range utilizing the plurality of second signals as gate inputs.

4. The logic circuit of claim 1, wherein the logic operation is a logical NOR operation having at least two inputs, the logic circuit having at least two corresponding level converters for the at least two inputs to provide a corresponding plurality of first signals and second signals, wherein:

the pull-low logic path comprises a plurality of transistors configured to perform a NOR logical operation in the first voltage range utilizing the plurality of first signals as gate inputs; and the pull-high logic path comprises a plurality of transistors configured to perform a NOR logical operation in the second voltage range utilizing the plurality of second signals as gate inputs.

* * * * *